United States Patent
Jang et al.

(10) Patent No.: US 11,374,680 B2
(45) Date of Patent: Jun. 28, 2022

(54) METHOD AND APPARATUS FOR PERFORMING ENCODING AND DECODING IN WIRELESS COMMUNICATION SYSTEM

(71) Applicant: Samsung Electronics Co., Ltd., Suwon-si (KR)

(72) Inventors: Min Jang, Suwon-si (KR); Peng Xue, Suwon-si (KR); Kyung Joong Kim, Suwon-si (KR); Hyun Seok Ryu, Suwon-si (KR); Se Ho Myung, Suwon-si (KR); Seok Ki Ahn, Suwon-si (KR); Hong Sil Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 17 days.

(21) Appl. No.: 15/733,092

(22) PCT Filed: Nov. 15, 2018

(86) PCT No.: PCT/KR2018/013962
§ 371 (c)(1),
(2) Date: May 14, 2020

(87) PCT Pub. No.: WO2019/098689
PCT Pub. Date: May 23, 2019

(65) Prior Publication Data
US 2020/0366404 A1 Nov. 19, 2020

(30) Foreign Application Priority Data
Nov. 16, 2017 (KR) .................. 10-2017-0153345

(51) Int. Cl.
*H04L 1/00* (2006.01)
*H04L 5/00* (2006.01)
*H03M 13/13* (2006.01)

(52) U.S. Cl.
CPC .......... *H04L 1/0008* (2013.01); *H03M 13/13* (2013.01); *H04L 1/003* (2013.01); *H04L 1/0061* (2013.01); *H04L 5/0094* (2013.01)

(58) Field of Classification Search
CPC combination set(s) only.
See application file for complete search history.

(56) References Cited

U.S. PATENT DOCUMENTS

| 2015/0077277 A1 | 3/2015 | Alhussien et al. |
| 2015/0349922 A1 | 12/2015 | Arikan |

(Continued)

FOREIGN PATENT DOCUMENTS

| KR | 10-2014-0077492 A | 6/2014 |
| KR | 10-2015-0032197 A | 3/2015 |

(Continued)

OTHER PUBLICATIONS

International Search Report and Written Opinion of the International Searching Authority in connection with International Application No. PCT/KR2018/013962 dated Feb. 27, 2019, 10 pages.

(Continued)

*Primary Examiner* — Yee F Lam

(57) ABSTRACT

The present disclosure relates to a 5th generation (5G) or pre-5G communication system for supporting a higher data transfer rate beyond a 4th generation (4G) communication system, such as long term evolution (LTE). The present disclosure provides a method and an apparatus for efficiently performing encoding and decoding of an information bit in a wireless communication system. The present disclosure relates to an operation method of a transmitting terminal in a wireless communication system, the method comprising the steps of: generating padding bits on the basis of information bits; generating an input bit sequence including the padding bits and the information bits; generating a message (Continued)

by encoding the input bit sequence by using a polar code; and transmitting the message.

12 Claims, 19 Drawing Sheets

(56) References Cited

U.S. PATENT DOCUMENTS

| | | |
|---|---|---|
| 2016/0241356 A1 | 8/2016 | Yang et al. |
| 2017/0187396 A1 | 6/2017 | Jeong et al. |
| 2017/0366199 A1* | 12/2017 | Ge .............. H04L 1/0053 |
| 2017/0366204 A1* | 12/2017 | Shi .............. H04L 25/061 |
| 2018/0013517 A1* | 1/2018 | Rong ............ H04L 1/0057 |
| 2018/0026663 A1* | 1/2018 | Wu ............. H03M 13/6362 714/776 |
| 2018/0048418 A1* | 2/2018 | Ge .............. H04L 1/0046 |
| 2018/0054278 A1* | 2/2018 | Shi ............. H03M 13/6502 |
| 2018/0076922 A1* | 3/2018 | Zhang ........... H03M 13/611 |
| 2018/0097580 A1* | 4/2018 | Zhang ........... H03M 13/13 |
| 2018/0183464 A1* | 6/2018 | Ge .............. H04L 1/0069 |
| 2018/0191459 A1* | 7/2018 | Ge .............. H03M 13/13 |
| 2018/0198894 A1* | 7/2018 | Nammi ........... H03M 13/13 |
| 2018/0248654 A1* | 8/2018 | Ge .............. H04L 1/0009 |
| 2018/0248655 A1* | 8/2018 | Belfiore ......... H04L 1/0058 |
| 2018/0278389 A1* | 9/2018 | Hamelin ......... H04L 1/0057 |
| 2018/0323905 A1* | 11/2018 | Shelby .......... H04L 1/0058 |
| 2018/0376463 A1* | 12/2018 | Sun ............. H04W 72/14 |
| 2019/0052487 A1* | 2/2019 | Shelby .......... H04L 1/0072 |
| 2019/0132005 A1* | 5/2019 | Chen ............ H03M 13/13 |
| 2019/0149173 A1* | 5/2019 | Chen ............ H04L 1/0041 714/758 |
| 2019/0207710 A1* | 7/2019 | Ye ............. H03M 13/6306 |
| 2019/0280829 A1* | 9/2019 | Wei ............ H03M 13/13 |
| 2019/0296776 A1* | 9/2019 | Xu ............. H03M 13/6356 |
| 2020/0252158 A1* | 8/2020 | Shen ............ H04L 1/0072 |

FOREIGN PATENT DOCUMENTS

| | | | |
|---|---|---|---|
| KR | 10-1617965 B1 | 5/2016 | |
| WO | 10-2015-060653 A1 | 4/2015 | |
| WO | 10-2016-141544 A1 | 9/2016 | |
| WO | WO-2017106246 A2 * | 6/2017 | ............ H03M 13/13 |

OTHER PUBLICATIONS

Korean Intellectual Property Office, "Notice of Preliminary Rejection" dated Feb. 21, 2022, in connection with Korean Patent Application No. 10-2017-0153345, 8 pages.

Intellectual Property India, "Examination Report under sections 12 & 13 of the Patents Act," dated May 11, 2022, in connection with Indian Patent Application No. 202017020414, 7 pages.

* cited by examiner

METHOD AND APPARATUS FOR PERFORMING ENCODING AND DECODING IN WIRELESS COMMUNICATION SYSTEM

CROSS-REFERENCE TO RELATED APPLICATIONS

This application is a 371 National Stage of International Application No. PCT/KR2018/013962, filed Nov. 15, 2018, which claims priority to Korean Patent Application No. KR 10-2017-0153345, filed Nov. 16, 2017, the disclosures of which are herein incorporated by reference in their entirety.

BACKGROUND

1. Field

The disclosure generally relates to a wireless communication system, and more particularly, to a method and an apparatus for performing encoding and decoding with respect to information in a wireless communication system.

2. Description of Related Art

Efforts to develop enhanced $5^{th}$ generation (5G) communication systems or pre-5G communication systems have been ongoing in order to meet the demand for increasing wireless data traffic since $4^{th}$ generation (4G) communication systems were commercialized. For this reason, the 5G communication systems or pre-5G communication systems are called Beyond 4G network communication systems or post long term evolution (LTE) systems.

The 5G communication system is considered to be implemented in a superhigh frequency (mmWave) band (for example, 60 GHz band) to achieve a high data transmission rate. For the 5G communication systems, technologies for beamforming, massive multiple input multiple output (MIMO), full dimensional MIMO (FD-MIMO), array antenna, analog beamforming, and large scale antenna are being discussed to mitigate a path loss of a radio wave and increase a transmission distance of a radio wave in the superhigh frequency band.

In addition, technologies for evolved small cell, enhanced small cells, cloud ratio access network (RAN), ultra-dense network, device to device communication (D2D), wireless backhaul, moving network, cooperative communication, coordinated multi-points (CoMP), and interference cancellation in the 5G communication systems are developing to enhance networks of the system.

In addition, hybrid frequency shift keying and quadrature amplitude modulation (FQAM) and sliding window superposition coding (SWSC), which are advanced coding modulation (ACM) methods, and filter bank multi carrier (FBMC), non-orthogonal multiple access (NOMA), and sparse code multiple access (SCMA) which are enhanced accessing technology in the 5G systems are developing.

In the 5G communication system, error correction technology for correcting a data error, which may be caused by a noise existing in a communication channel when data is transmitted and received between a transmitting node and a receiving node, is considered. According to the error correction technology, an error caused by a communication channel may be corrected at the receiving node by adding an additional bit to data to be transmitted and transmitting the data. Accordingly, a specific procedure for introducing error correction technology in the 5G system is being discussed.

SUMMARY

Based on the above-described discussion, the disclosure provides a method and an apparatus for effectively performing encoding and decoding with respect to information in a wireless communication system.

According to various embodiments, an operating method of a transmitting node in a wireless communication system includes: generating padding bits based on information bits; generating an input bit sequence including the padding bits and the information bits; generating a message by encoding the input bit sequence by using a polar code; and transmitting the message.

According to various embodiments, an operating method of a receiving node in a wireless communication system may include: receiving a message; decoding a first field including format identifier information in the message according to a polar code; and decoding a second field including information bits and padding bits, based on the format identifier information.

According to various embodiments, an apparatus of a transmitting node in a wireless communication system may include: a transceiver configured to transmit and receive a signal; and at least one processor, wherein the at least one processor is configured to: generate padding bits based on information bits; generate an input bit sequence including the padding bits and the information bits; generate a message by encoding the input bit sequence by using a polar code; and transmit the message.

According to various embodiments, an apparatus of a receiving node in a wireless communication system may include a transceiver configured to transmit and receive a signal, and at least one processor, wherein the at least one processor is configured to: receive a message; decode a first field including format identifier information in the message according to a polar code; and decode a second field including information bits and padding bits, based on the format identifier information.

The method and the apparatus according to various embodiments of the disclosure can provide excellent error correction performance.

The effects that can be achieved by the disclosure are not limited to those mentioned in the above, and other effects that are not mentioned herein could be clearly understood by a person skilled in the art based on the following descriptions.

DETAILED DESCRIPTION

Terms used in the disclosure are used to describe specified embodiments and are not intended to limit the scope of other embodiments. The terms of a singular form may include plural forms unless otherwise specified. All of the terms used herein, which include technical or scientific terms, may have the same meaning that is generally understood by a person skilled in the art. It will be further understood that terms, which are defined in a dictionary, may be interpreted as having the same or similar meanings as or to contextual meanings of the relevant related art and not in an idealized or overly formal way, unless expressly so defined herein in the disclosure. In some cases, even if the terms are terms which are defined in the specification, they should not be interpreted as excluding embodiments of the present disclosure.

In various embodiments of the disclosure described below, hardware-wise approach methods will be described by way of an example. However, various embodiments of the disclosure include technology using both hardware and software, and thus do not exclude software-based approach methods.

The disclosure relates to a method and an apparatus for performing encoding and decoding. Specifically, the disclosure describes a method and an apparatus for efficiently performing encoding and decoding with respect to an information bit with a polar code.

As used herein, terms indicating a signal, terms indicating an element of an apparatus are merely examples for convenience of explanation. Accordingly, the disclosure is not limited to the terms described below, and other terms having the same technical meanings may be used.

In addition, the disclosure describes various embodiments by using terms used in some communication standards (for example, $3^{rd}$ generation partnership project (3GPP)), but this is merely for explanation. Various embodiments of the disclosure may be easily modified and applied to other communication systems.

Figure 1:
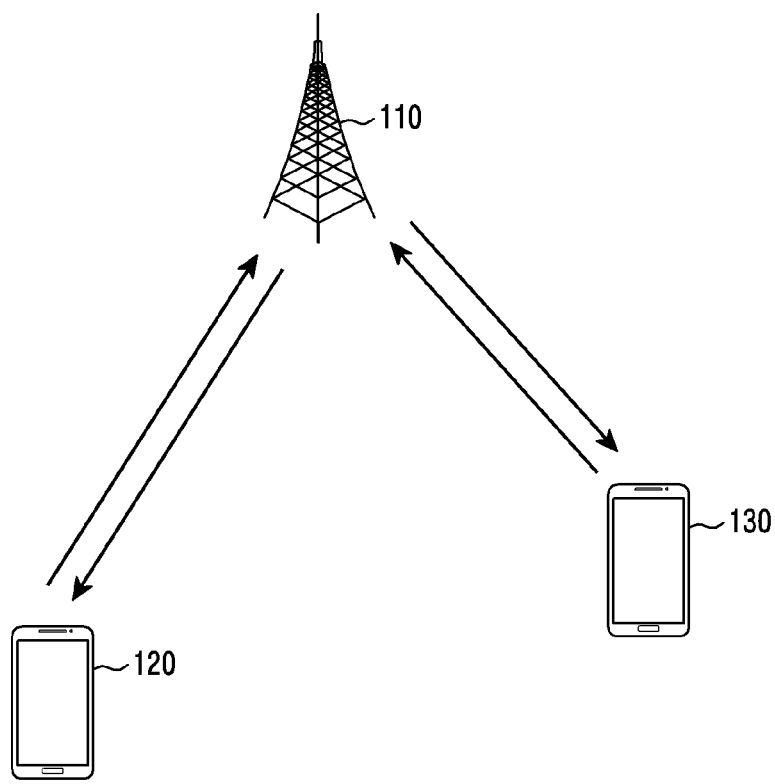
FIG. 1 is a view illustrating a wireless communication system according to various embodiments of the disclosure.

FIG. 1 illustrates a wireless communication system according to various embodiments of the disclosure. FIG. 1 illustrates a base station 110, a terminal 120, and a terminal 130 as a part of nodes using a wireless channel in a wireless communication system. FIG. 1 illustrates only one base station, but other base stations which are the same as or similar to the base station 110 may further be included.

The base station 110 is a network infrastructure that provides wireless access to the terminals 120, 130. The base station 110 has a coverage that is defined as a predetermined geographical area based on a distance by which a signal can be transmitted. The base station 110 may be referred to as "access point (AP)," "eNodeB (eNB)," "$5^{th}$ generation (5G) node," "wireless point," "transmission/reception point (TRP)," or other terms having the same technical meaning as the above-mentioned terms, in addition to the base station.

Each of the terminal 120 and the terminal 130 is a device which is used by a user, and may communicate with the base station 110 through a wireless channel. In some cases, at least one of the terminal 120 and the terminal 130 may be operated without user's intervention. That is, at least one of the terminal 120 and the terminal 130 is a device which performs machine type communication (MTC), and may not be carried by a user. Each of the terminal 120 and the terminal 130 may be referred to as "user equipment (UE)," "mobile station," "subscriber station," "remote terminal," "wireless terminal," or "user device," or other terms having the same technical meaning as the above-mentioned terms, in addition to the terminal.

Figure 2:
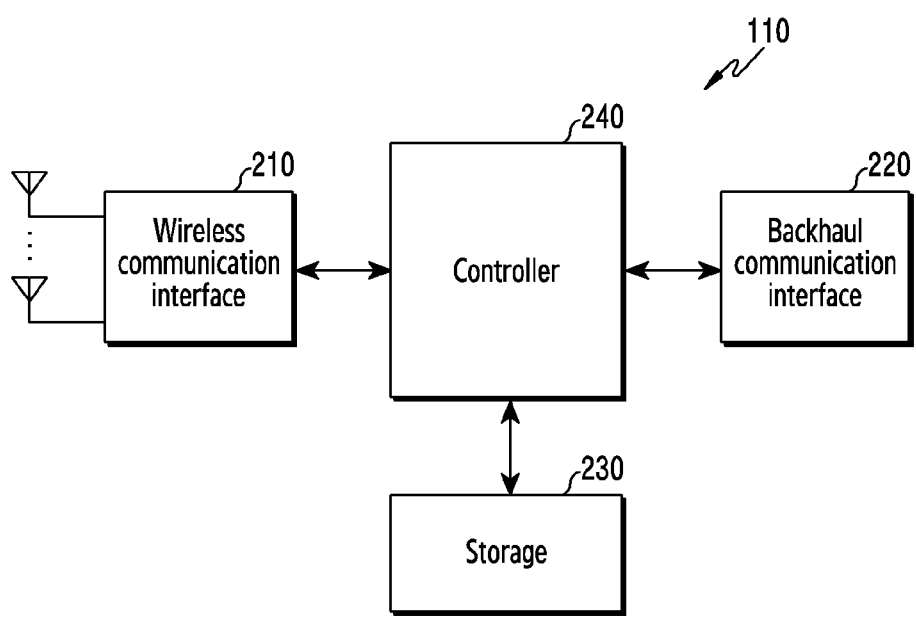
FIG. 2 is a view illustrating a configuration of a base station in a wireless communication system according to various embodiments of the disclosure.

FIG. 2 illustrates a configuration of a base station in a wireless communication system according to various embodiments of the disclosure. The configuration illustrated in FIG. 2 may be understood as a configuration of the base station 110. The term "unit" or terms ending with suffixes "-er," and "-or" refer to a unit processing at least one function or operation, and may be implemented by hardware, software, or a combination of hardware and software.

Referring to FIG. 2, the base station 110 may include a wireless communication unit 210, a backhaul communication unit 220, a storage 230, and a controller 240.

The wireless communication unit 210 performs functions for transmitting and receiving signals via a wireless channel. For example, the wireless communication unit 210 may perform a function of converting between a baseband signal and a bit stream according to a physical layer standard of the system. For example, when transmitting data, the wireless communication unit 210 may generate complex symbols by encoding and modulating a transmission bit stream. In addition, when receiving data, the wireless communication unit 210 may restore a reception bit stream by demodulating and decoding a baseband signal. In addition, the wireless communication unit 210 may up-convert a baseband signal into a radio frequency (RF) band signal, and then may transmit the signal via an antenna, and may down-convert an RF band signal received via an antenna into a baseband signal.

To achieve this, the wireless communication unit 210 may include a transmission filter, a reception filter, an amplifier, a mixer, an oscillator, a digital to analog converter (DAC), an analog to digital converter (ADC), or the like. In addition, the wireless communication unit 210 may include a plurality of transmission and reception paths. Furthermore, the wireless communication unit 210 may include at least one antenna array including a plurality of antenna elements. In the hardware aspect, the wireless communication unit 210 may be configured by a digital unit and an analog unit, and the analog unit may be configured by a plurality of sub-units according to operating power, an operating frequency, or the like.

The wireless communication unit 210 may transmit and receive signals as described above. Accordingly, an entirety or a portion of the wireless communication unit 210 may be referred to as a "transmitter," "receiver," or "transceiver." In addition, in the following description, transmitting and receiving via a wireless channel may be used as a meaning including processing by the wireless communication unit 210 as described above.

The backhaul communication unit 220 provides an interface for communicating with the other nodes in the network. That is, the backhaul communication unit 220 may convert a bit stream to be transmitted from the base station 110 to another node, for example, another access node, another base station, an upper node, a core network, or the like, into a physical signal, and may convert a physical signal transmitted from another node into a bit stream.

The storage 230 may store data such as a basic program for the operation of the base station 110, an application program, configuration information, or the like. The storage 230 may be configured by a volatile memory, a nonvolatile memory, or a combination of a volatile memory and a nonvolatile memory. In addition, the storage 230 provides stored data according to a request of the controller 240.

The controller 240 controls overall operations of the base station 110. For example, the controller 240 may transmit and receive signals via the wireless communication unit 210 or the backhaul communication unit 220. In addition, the controller 240 may write and read out data on or from the storage 230. In addition, the controller 240 may perform functions of a protocol stack required by the communication standard. To achieve this, the controller 240 may include at least one processor.

According to various embodiments, the controller 240 may control to generate an input bit sequence including padding bits generated based on information bits, and information bits, and to encode the input bit sequence by using a polar code. For example, the controller 240 may control the base station to perform operations according to various embodiments, which will be described below.

Figure 3:
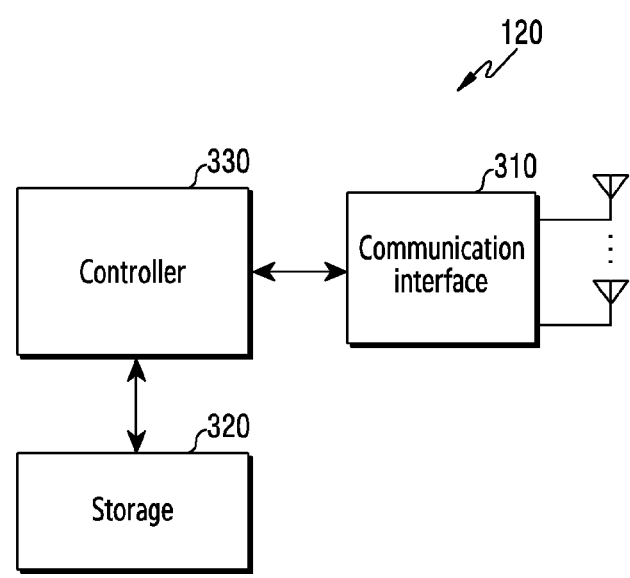
FIG. 3 is a view illustrating a configuration of a terminal in a wireless communication system according to various embodiments of the disclosure.

FIG. 3 illustrates a configuration of a terminal in a wireless communication system according to various embodiments of the disclosure. The configuration illustrated in FIG. 3 may be understood as a configuration of the terminal 120. The term "unit" or terms ending with suffixes "-er," and "-or" used in the following description refer to a unit processing at least one function or operation, and may be implemented by hardware, software, or a combination of hardware and software. In various embodiments of the disclosure, each of the terminal 120 and the terminal 130 may include an encoder/decoder to encode/decode a signal, and the encoder/decoder may be implemented by at least one processor.

Referring to FIG. 3, the terminal 120 may include a communication unit 310, a storage 320, and a controller 330.

The communication unit 310 performs functions for transmitting and receiving signals via a wireless channel. For example, the communication unit 310 may perform a function of converting between a baseband signal and a bit stream according to a physical layer standard of the system. For example, when transmitting data, the communication unit 310 may generate complex symbols by encoding and modulating a transmission bit stream. In addition, when receiving data, the communication unit 310 may restore a reception bit stream by demodulating and decoding a baseband signal. In addition, the communication unit 310 may up-convert a baseband signal into an RF band signal, and then may transmit the signal via an antenna, and may down-convert an RF band signal received via an antenna into a baseband signal. For example, the communication unit 310 may include a transmission filter, a reception filter, an amplifier, a mixer, an oscillator, a DAC, an ADC, or the like.

In addition, the communication unit 310 may include a plurality of transmission and reception paths. Furthermore, the communication unit 310 may include at least one antenna array including a plurality of antenna elements. In the hardware aspect, the communication unit 310 may be configured by a digital circuit and an analog circuit (for example, a radio frequency integrated circuit (RFIC)). Herein, the digital circuit and the analogue circuit may be implemented as a single package. In addition, the communication unit 310 may include a plurality of RF chains. Furthermore, the communication unit 310 may perform beamforming.

The communication unit 310 may transmit and receive signals as described above. Accordingly, an entirety or a portion of the communication unit 310 may be referred to as a "transmitter," "receiver," or "transceiver." In addition, an entirety or a portion of the communication unit 310 may be implemented by a "transmitter," "receiver," or "transceiver." In the following description, transmitting and receiving via a wireless channel may be used as a meaning including processing by the communication unit 310 as described above.

The storage 320 may store data such as a basic program for the operation of the terminal 120, an application program, configuration information, or the like. The storage 320 may be configured by a volatile memory, a nonvolatile memory, or a combination of a volatile memory and a nonvolatile memory. In addition, the storage 320 provides stored data according to a request of the controller 330.

The controller 330 controls overall operations of the terminal 120. For example, the controller 330 may transmit and receive signals via the communication unit 310. In addition, the controller 330 may write and read out data on or from the storage 320. In addition, the controller 330 may perform functions of a protocol stack required by the communication standard. To achieve this, the controller 330 may include at least one processor or microprocessor, or may be a portion of a processor. In addition, a portion of the communication unit 310 and the controller 330 may be referred to as a communication processor (CP).

According to various embodiments, the controller 330 may be configured to control the communication unit 310 to receive a message, to decode a first field including format identifier information in the message according to a polar code, and to decode a second field including information bits and padding bits based on the format identifier information. For example, the controller 330 may control the terminal to perform operations according to various embodiments, which will be described below.

Figure 4:
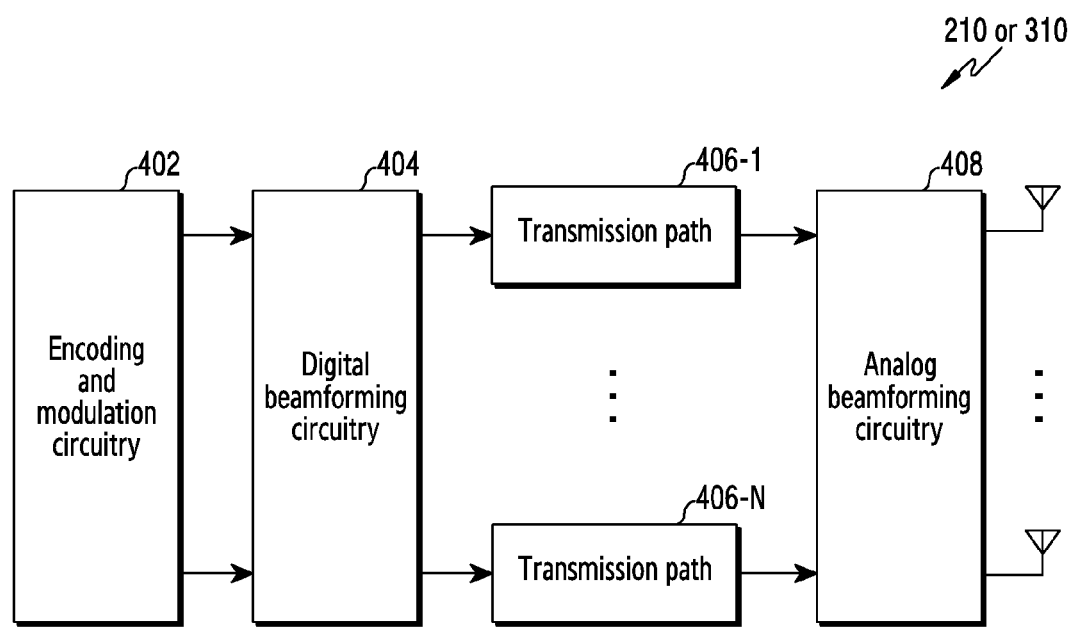
FIG. 4 is a view illustrating a configuration of a communication unit in a wireless communication system according to various embodiments of the disclosure.

FIG. 4 illustrates a configuration of a communication unit in a wireless communication system according to various embodiments of the disclosure. FIG. 4 illustrates an example of a detailed configuration of the wireless communication unit 210 of FIG. 2 or the wireless communication 210 of FIG. 3. Specifically, FIG. 4 illustrates components for performing beamforming as a portion of the wireless communication unit 210 of FIG. 2 or the communication unit 310 of FIG. 3.

Referring to FIG. 4, the wireless communication unit 210 or the communication unit 310 may include an encoding and modulation unit 402, a digital beamforming unit 404, a plurality of transmission paths 406-1 to 406-N, an analog beamforming unit 408. If the wireless communication unit 210 or the communication unit 310 does not perform beamforming according to an embodiment, the digital beamforming unit 404 and the analog beamforming unit 408 may be omitted and one transmission path may be provided.

The encoding and modulation unit 402 performs channel encoding. To perform channel encoding, at least one of a low density parity check (LDPC) code, a convolution code, a polar code may be used. The encoding and modulation unit 402 may generate modulation symbols by performing constellation mapping.

The digital beamforming unit 404 performs beamforming with respect to a digital signal (for example, modulation symbols). To achieve this, the digital beamforming unit 404 multiplies modulation symbols by beamforming weights. Herein, the beamforming weights may be used to change a size and a phase of a signal, and may be referred to as "precoding matrix," "precoder." The digital beamforming unit 404 outputs digitally beamformed modulation symbols to the plurality of transmission paths 406-1 to 406-N. In this case, according to the multiple input multiple output (MIMO) transmission technique, the modulation symbols may be multiplexed, or the same modulation symbols may be provided to the plurality of transmission paths 406-1 to 406-N.

The plurality of transmission paths 406-1 to 406-N convert the digitally beamformed digital signals into analogue signals. To achieve this, each of the plurality of transmission paths 406-1 to 406-N may include an inverse fast Fourier transform (IFFT) calculation unit, a cyclic prefix (CP) insertion unit, a DAC, an up-conversion unit. The CP insertion unit is to perform orthogonal frequency division multiplexing (OFDM), and may be excluded when other physical layer methods (for example, a filter bank multi-carrier (FBMC)) are applied. That is, the plurality of transmission paths 406-1 to 406-N provide independent signal processing processes with respect to a plurality of streams generated through digital beamforming. However, some of the components of the plurality of transmission paths 406-1 to 406-N may be used in common according to an implementation method.

The analogue beamforming unit 408 performs beamforming with respect to an analogue signal. To achieve this, the digital beamforming unit 404 multiplies the analogue signals by beamforming weights. Herein, the beamforming weights may be used to change a size and a phase of a signal.

When data is transmitted and received between a transmitting node and a receiving node in a wireless communication system, a data error may occur due to a noise existing in a communication channel. There exists an error correction coding method as a coding method designed to correct an error caused by a communication channel at a receiving node. Such error correction coding may be referred to as channel coding. The error correction coding method refers to a technique of adding a redundant bit to data to be transmitted and transmitting the data.

The error correction coding technique includes various methods. For example, convolutional coding, turbo coding, low-density parity-check (LDPC) coding, and polar coding exist.

A polar code in such error correction coding techniques is an error correction code that was suggested by E. Arikan, and uses the channel polarization phenomenon, and is the first error correction code that is verified as achieving a channel capacity, which is a data transmission limit in binary discrete memoryless channels (B-DMCs), while having low coding/complexity performance. The polar code makes it possible to design coding optimized to each channel or code rate through density evolution, Gaussian approximation (GA), reciprocal channel approximation (RCA), or the like.

The polar code has advantages in error correction performance and decoding complexity when a code of a short length is transmitted, compared to a turbo code, an LDPC code which are other capacity-approaching codes. Due to these advantages, in the 3GPP new radio (NR) standardization which is in progress for $5^{th}$ generation (5G) mobile communication, the polar code is decided to be used to transmit control information of a short length.

In a 3GPP NR communication system using the polar code, 1) a format indicator (FI) of downlink control information (DCI) indicates a length of DCI that variably changes, 2) a rank indicator (RI) of uplink channel state information (CSI) indicates a length of a precoding matrix indicator (PMI), a channel quality indicator (CQI) which is another field. If a message of a variable length is simply encoded by using a polar code, the receiving node does not know the length of the message although there are some fields indicating the total length, and may not determine where to start decoding. Accordingly, the receiving node should perform blinding decoding many times to identify the length of the message, which causes problems of power consumption and an increasing delay.

Accordingly, the present disclosure provides a method and an apparatus for efficiently encoding and decoding an information bit sequence of a variable length by using a polar code, by making some bits of the information bit sequence indicate a length of a whole message.

In the following description, a device performing encoding is referred to as a "transmitting node," and a device performing decoding is referred to as a "receiving node." In the case of downlink communication, the transmitting node is a base station (for example, the base station 110), and the receiving node is a terminal (for example, the terminal 120, the terminal 130). In the case of uplink communication, the transmitting node is a terminal (for example, the terminal 120, the terminal 130), and the receiving node is a base station (for example, the base station 110).

Figure 5:
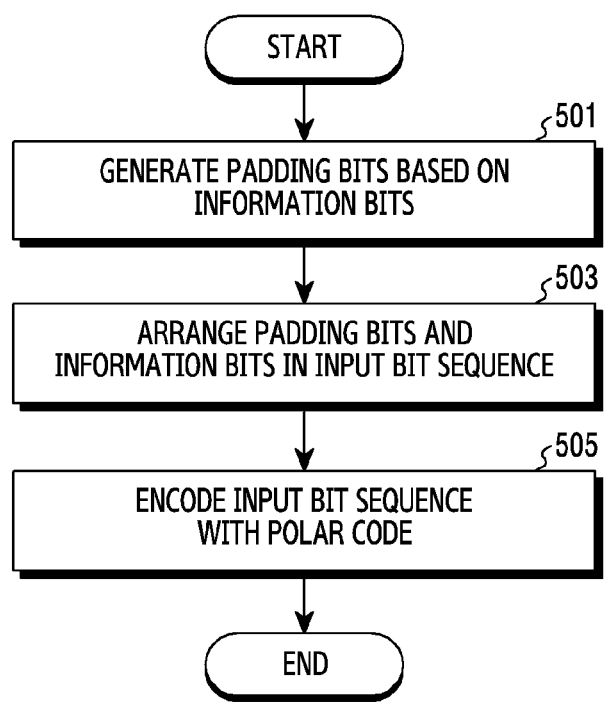
FIG. 5 is a flowchart for encoding at a transmitting node in a wireless communication system according to various embodiments of the disclosure.

FIG. 5 illustrates a flowchart for encoding at a transmitting node in a wireless communication system according to various embodiments of the disclosure. FIG. 5 illustrates an operating method of the transmitting node.

Referring to FIG. 5, at step 501, the transmitting node determines the number of padding bits based on a difference between a maximum length of a sequence of information bits and a real length, and then generates as many padding bits as the determined number of padding bits. The transmitting node generates padding bits based on information bits. Alternatively, the transmitting node may generate padding bits as zero. According to an embodiment, the padding bits may be generated by repeating the information bits in the unit of n bits, where n is a predetermined integer. According to another embodiment, the padding bits may be generated by linearly combining the information bits.

At step 503, the transmitting node generates an input bit sequence including the padding bits and the information bits, by mixing the information bit sequence containing the information bits to be transmitted with the padding bits. The input bit sequence may include a mixture field of some information bits and the padding bits, and some of the information bits and the padding bits may coexist in the mixture field. Specifically, the information bits and the padding bits may be arranged in an appropriate order in the mixture field. The information bit sequence is mapped onto the input bit sequence after going through outer coding. Herein, the input bit sequence may further include a format identifier field, and the format identifier field may indicate the number of padding bits.

At step 505, the transmitting node encodes the input bit sequence by using a polar code, by generating an encoding output bit sequence by multiplying the input bit sequence and a generator matrix of the polar code.

Figure 6:
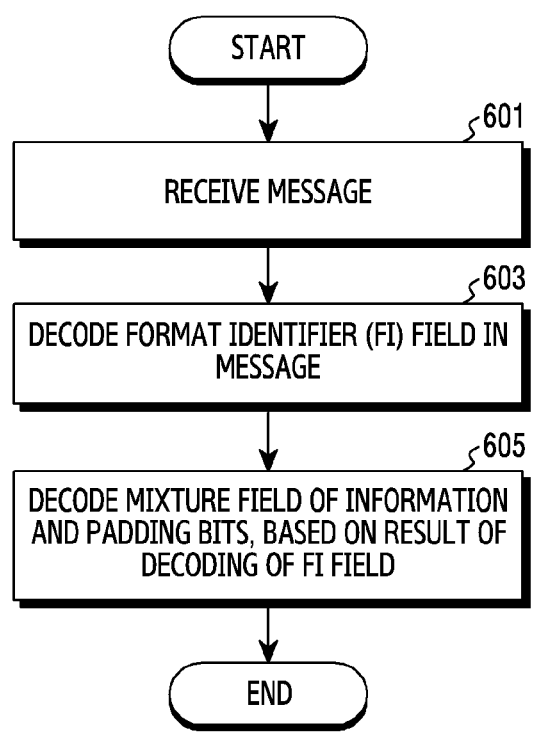
FIG. 6 is a flowchart for decoding at a receiving node in a wireless communication system according to various embodiments of the disclosure.

FIG. 6 illustrates a flowchart for decoding at a receiving node in a wireless communication system according to various embodiments. FIG. 6 illustrates an operating method of the receiving node.

Referring to FIG. 6, at step 601, the receiving node receives a message which is encoded by using a polar by the transmitting node through the process of FIG. 5.

At step 603, the receiving node performs decoding such as successive-cancellation (SC), SC-list (SCL), SC-stack (SC S), or the like for the polar code, and accordingly, obtains the format identifier (FI) field, which is initially decoded in the message, first, in the middle of the decoding process. Specifically, the receiving node may determine a probability regarding a bit based on the bit decoded first, and may leave L number of paths having high probabilities, where L is a predetermined integer, and may perform decoding with respect to the subsequent bits, such that decoding is performed with realistic complexity. The probability refers to a probability that the transmitting node transmits the corresponding bit. The process of determining the probability may include a process of determining the probability by considering generation of padding bits based on information bits. Herein, the padding bits may be zero or may be generated based on the information bits. The number of padding bits may be determined based on a difference between a maximum length of a sequence of the information bits and a real length. The format identifier field may indicate the number of padding bits.

At step 605, the receiving node decodes the mixture field of the information bits and the padding bits, based on the decoded format identifier field. Specifically, the receiving node recognizes a length of the information bits and a length of the padding bits according to a value of the format identifier field decoded first, and then, may perform decoding with respect to the mixture field of the information bits and the padding bits in order of a bit index. The receiving node may prune a decoding path of a low probability based on the determined probability, and may perform decoding with respect to a predetermined number of decoding paths having high probabilities.

Figure 7:
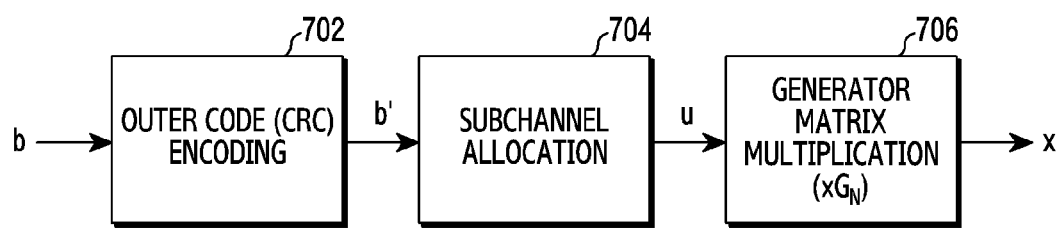
FIG. 7 is a view illustrating an example of an encoding process of a polar code in a wireless communication system according to various embodiments of the disclosure.

FIG. 7 illustrates an example of an encoding process of a polar code in a wireless communication system according to various embodiments. Respective steps of the encoding process of FIG. 7 may be performed by a portion of the controller 330 included in the transmitting node, respectively. Accordingly, FIG. 7 may be understood as illustrating some configurations of the controller 330 included in the transmitting node.

The encoding process of the polar code may add an additional process according to the requirements of a communication system. In the encoding process, the number of information bits to be transmitted is K, and the number of codeword bits to be encoded and transmitted through a channel is M. An example of the encoding process of the polar code may include 1) information bit sequence generation, 2) outer coding, 3) subchannel allocation, and 4) generator matrix multiplication, and details thereof are as follows:

1) Information Bit Sequence Generation

An information bit sequence $b=\{b_0, b_1, \ldots, b_{K-1}\}$ to be transmitted is given.

2) Outer Code

The information bit sequence b is generally encoded by using an outer code by an outer code encoding block 702 to enhance performance. The outer code used may include an error detection code such as a cyclic redundancy check (CRC) code, or an error correction code such as a BHC code, a single parity check code, or the like. A length of a parity generated by the outer code is referred to as Lower, and a bit sequence generated as a result of outer coding is referred to as $b'=\{b'_0, b'_1, \ldots, b'_{K+L_{outer}-1}\}$. Since the outer coding is not an essential operation, $L_{outer}=0$, $b'=b$ if outer coding is not considered.

3) Subchannel Allocation

A subchannel allocation block 704 maps the bit sequence b' onto a bit sequence $u=\{u_0, u_1, \ldots, u_{N-1}\}$ of a length N for the sake of polar code encoding. Herein, N is a size of a mother polar code and indicates the power of 2, and is determined by a predetermined criterion from among values larger than $K+L_{outer}$. u is an input bit sequence of polar code encoding, and bits of b' are mapped onto u according to pre-defined method and criterion. In the 3GPP NR, a bit index of u onto which respective bits of b' are mapped is defined in the form of a sequence. The respective bits of the encoding input bit sequence u obtained through this process may be interpreted as passing through subchannels of different qualities by channel polarization. Due to this characteristic, the process of mapping b' onto u is referred to as a subchannel allocation process.

4) Generator Matrix Multiplication

A generator matrix multiplication block 706 generates an encoding output bit sequence x of the same length N by multiplying the encoding input bit sequence u of the length N and a generator matrix G of the polar code. When the polar code was suggested by Arikan for the first time, the generator matrix G was defined as follows:

In Equation 1, $$F = \begin{bmatrix} 1 & 0 \\ 1 & 1 \end{bmatrix},$$

and an operation of superscript ⊗ n refers to the nth Kronekcer power. For example, $$F^{\otimes 2} = \begin{bmatrix} F & 0 \\ F & F \end{bmatrix} \text{ and } F^{\otimes 3} = \begin{bmatrix} F^{\otimes 2} & 0 \\ F^{\otimes 2} & F^{\otimes 2} \end{bmatrix}.$$

In addition, $B_N$ is a bit reversal permutation matrix of N×N. For example, $\{a_0, a_4, a_2, a_6, a_1, a_5, a_3, a_7\}$ is obtained by multiplying $\{a_0, a_1, a_2, a_3, a_4, a_5, a_6, a_7\}$ and Bs. However, in recent various documents and systems including the 3GPP NR, a generator matrix of a simple form without $B_N$ as presented below is considered:

$$G = F^{\otimes \log_2 N} \qquad \text{Equation 2}$$

A generator matrix defined as $G = F^{\otimes \log_2 N}$ is assumed hereinbelow unless otherwise specified. It should be noted that explanations on the above-described assumption are easily substituted with explanations of a polar code using the generator matrix defined as $G = F^{\otimes \log_2 N}$ based on operation of bit reversal permutation.

Figure 8:
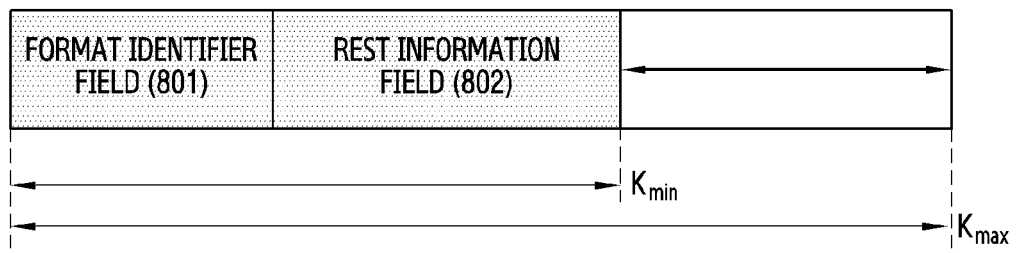
FIG. 8 is a view illustrating a configuration of an information bit sequence of a variable length that is formed of a format identifier field and other information fields in a wireless communication system according to various embodiments of the disclosure.

FIG. 8 illustrates a configuration of an information bit sequence of a variable length that is formed of a format identifier field and other information fields in a wireless communication system according to various embodiments of the disclosure.

In an embodiment of the disclosure, a message encoded with a polar code has the characteristics as shown in FIG. 7. An information bit sequence to be transmitted may have various formats, and the length K of the information bit sequence changes between a minimum length $K_{min}$ and a maxim length $K_{max}$. Some bits of the information bit sequence may be used to indicate or infer the variable length (or format) K of the information bit sequence, and such a portion used to indicate or infer the length is referred to as a format identifier (FI) field 801.

An example of the information bit sequence having the above-described characteristic may be channel state information (CSI) of downlink control information (DCI) transmitted through a downlink control channel of the 3GPP NR standard, which is being currently standardized, and uplink control information (UCI) transmitted through an uplink control channel. The DCI may include a bit or a field referred to as a format indicator, and this bit or field may act as a format identifier field indicating a format including a length of DCI. That is, if the receiving node can know a value of the format indicator, the receiving node can identify the length of the whole DCI through this. The CSI which is fed back through uplink is formed of fields of a rank indicator (RI), a CSI-reference signal (RS) resource indicator (CRI), a channel quality indicator (CQI), a precoding matrix indicator (PMI), etc., and the respective fields are associated with one another. For example, the PMI and the CQI of the CSI fed back for a multi input multi output (MIMO) system may have information of different formats by a rank value. Accordingly, formats including an RI value and the lengths of the PMI and the CQI in the CSI are associated with one another, and the lengths of the PMI and the CQI can be known as long as the RI value is known.

In an embodiment of the disclosure, the transmitting node encodes the information bit sequence of the variable length by using the polar code, and transmits the information bit sequence, and the receiving node considers an environment where the length of the information bit sequence is not known at the start of decoding with the polar code. An environment where DCI and CSI of 3GPP NR are received belongs to the case where the number of information bits is not known at the time of decoding by the receiving node. Since a correct configuration of a decoder is impossible if the receiver does not know the length of a real information bit sequence, the receiver cannot try to perform exact decoding with respect to a signal in which an information bit sequence of a variable length is encoded in a general method. Accordingly, the receiving node may perform blinding decoding to perform decoding with all decoder configurations as far as possible, and to identify a result of decoding with an error detection code such as CRC, etc. However, the blind decoding method may cause problems of decoding complexity and an increasing delay since the receiving node tries to decode with the polar code many times. Therefore, padding for configurating an information bit sequence of a maximum message length $K_{max}$ regardless of the number of information bits K to be transmitted, and for fixing the $K_{max}-K$ bit to a value promised between the transmitting node and the receiving node may be considered.

Figure 9:
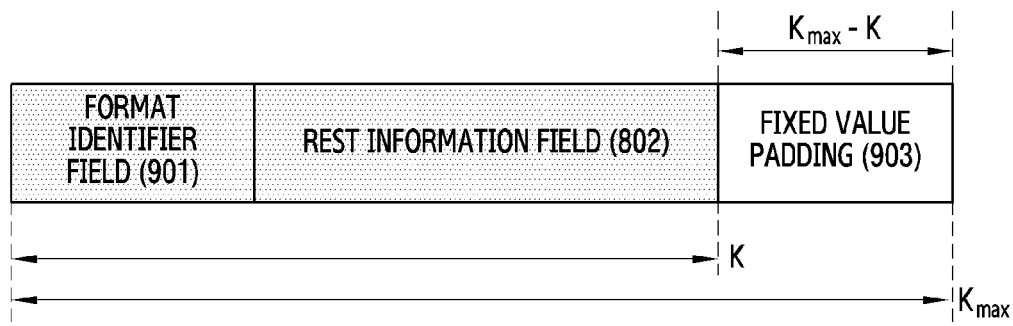
FIG. 9 is a view illustrating a configuration of an information bit sequence applying fixed value padding in a wireless communication system according to various embodiments of the disclosure.

FIG. 9 illustrates a configuration of an information bit sequence applying fixed value padding in a wireless communication system according to various embodiments of the disclosure.

Referring to FIG. 9, a value of a padding bit is a pre-determined value, and may be known even if the receiving node does not perform decoding, and, in view of normal channel coding, encoding/decoding is performed in the same way as when channel coding is shortened, such that error correction performance can be enhanced. For example, the value of the padding bit may be pre-set to zero. Accordingly, the fixed value padding may be referred to as zero padding.

There are two methods for decoding a signal which has been encoded with a polar code by applying fixed value padding with a format identifier field as follows:

1) The receiving node may decode by dealing with padding bits as information bits. After decoding, the receiving node may know how many padding bits are through a value of the format identifier field. In addition, the receiving node may additionally perform error detection by comparing a pre-fixed padding bit value and a padding bit value which is obtained after decoding. When decoding is performed by dealing with the padding bit as the information bit as described above, there is no great influence on the error correction performance wherever the format identifier field and the padding bit are in the input bit sequence u of the polar code.

2) The receiving node may determine the number of padding bits through the format identifier field, first, and accordingly, may decode by dealing with the padding bits as frozen bits. SC-based decoding is performed by decoding bits of u in sequence one by one. Accordingly, if the format identifier field is arranged ahead of the padding bits, the receiving node may decode the format identifier field, first, and may grasp how many padding bits are and where the padding bits are positioned, and accordingly, may proceed with decoding by dealing with the padding bits as known values, that is, frozen bits, such that error correction performance can be enhanced. When decoding by substituting the padding bits with the frozen bits is considered, the format identifier field should be positioned ahead of the padding bits in view of the order of decoding, and the padding bits should be arranged where reliability (for example, a channel capacity) is low, except for the format identifier field, in the encoding bit sequence u. Accordingly, for the error correction performance, it is advantageous to map the format identifier field onto the bit of the lowest index from among Kmax number of bit positions onto which the information bit sequence is mapped in the encoding bit sequence u, and to map the padding bits onto the bits of low reliability from among the other bits except for the format identifier field. However, since it may be a complex process to consider different criteria, that is, the order of decoding in mapping the format identifier field and the order of reliability in mapping the padding bits, the format identifier field and the padding bits may be mapped by considering only one criteria, the order of decoding. That is, the format identifier field may be mapped onto the bit of the lowest index, and the padding bits may be mapped onto the bits of the next lowest index.

Figure 10:
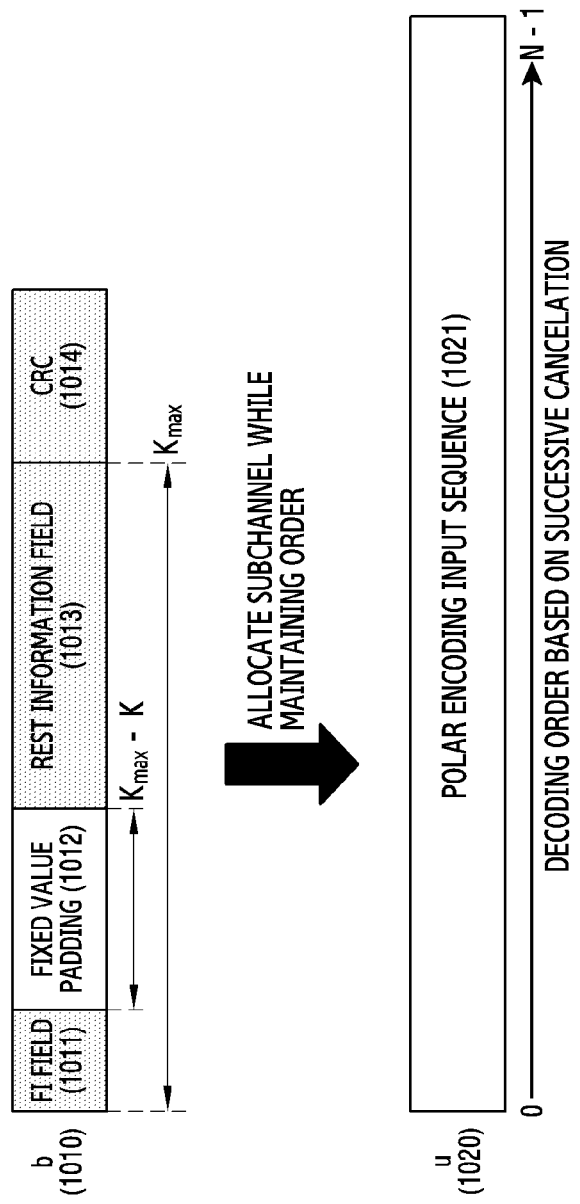
FIG. 10 is a view illustrating a configuration of an information bit sequence through generation of a fixed value padding bit, and a process of mapping the same onto a polar code input bit sequence in a wireless communication system according to various embodiments of the disclosure.

FIG. 10 illustrates a configuration of an information bit sequence through generation of fixed value padding bits, and a process of mapping the same onto a polar code input bit sequence in a wireless communication system according to various embodiments of the disclosure.

Referring to FIG. 10, an information bit sequence b 1010 of a length $K_{max}$ including padding bits may be arranged in an encoding bit sequence u 1020 of a length N to allow a decoder to deal with the padding bits as frozen bits. The information bit sequence b 1010 is configured with a format identifier field 1011, a padding bit field 1012, a rest information bit field 1013, and a parity bit field 1014 generated by outer coding such as a CRC code, etc., which are arranged in the listed order. Herein, a length of the outer coding parity bit field 1013 may be 0. In addition, the respective bits of the information bit sequence b 1010 may be mapped onto pre-defined positions of the encoding bit sequence u 1020. Herein, the order of the information bit sequence b 1010 is maintained as it is in the encoding bit sequence u 1020. That is, the format identifier field 1011 may be positioned at the lowest index bit from among the bits other than frozen bits in the encoding bit sequence u 1020, and the padding bit field 1012, the rest information bit field 1013, and the outer coding parity bit field 1013 are positioned in order.

Figure 11:
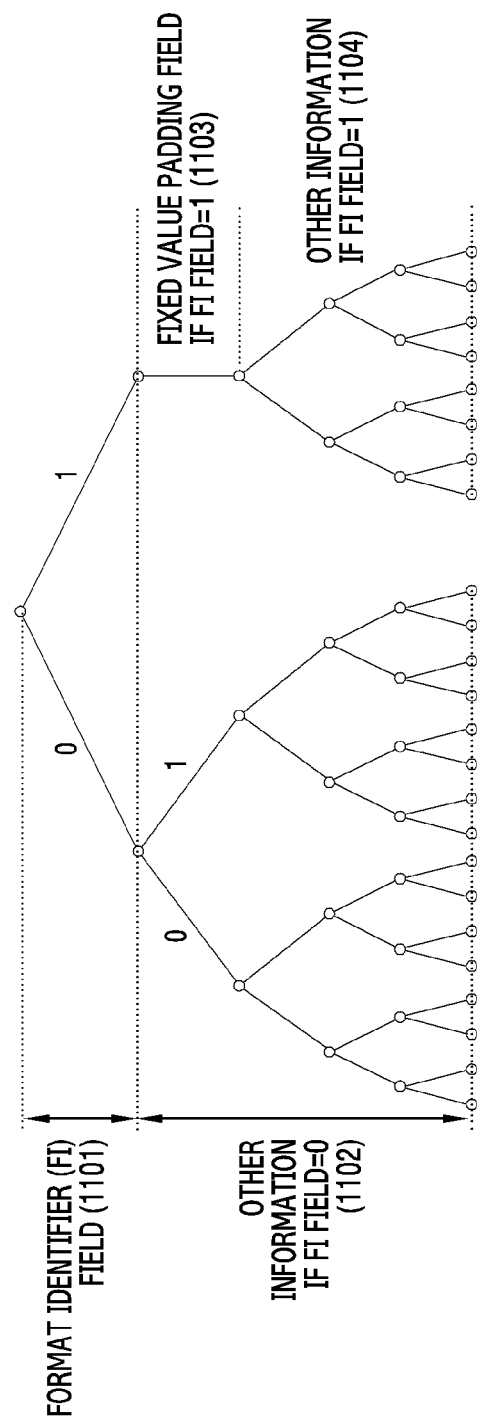
FIG. 11 is a view illustrating a process of decoding a signal generated by encoding an information bit sequence through generation of a fixed value padding bit in a wireless communication system according to various embodiments of the disclosure.

FIG. 11 illustrates a process of decoding a signal which is generated by encoding an information bit sequence through generation of fixed value padding bits in a wireless communication system according to various embodiments of the disclosure.

FIG. 11 conceptually illustrates a process of SC-list (SCL) decoding, at a receiving node, a signal generated by encoding the information bit sequence 1010 including the padding bit field 1012 generated as a fixed value in FIG. 10, and illustrates decoding paths for unfrozen bits that are configured in an SCL decoder.

Referring to FIG. 11, the format identifier field is configured with 1 bit. If a value of the format identifier field 1101 is 0, the rest information bits may be 4 bits, and, if a value of the format identifier field 1101 is 1, the other information bits may be 3 bits and a padding bit of 1 bit may be inserted.

In the decoding paths of FIG. 11, if a value of the format identifier field 1101 is 0, there is no padding bit, and thus the decoder proceeds with SCL decoding with respect to all of the bits by considering both the case where the bit is 0 and the case where the bit is 1 (1102). In the decoding paths of FIG. 11, when a value of the format identifier field 1101 is 1, the padding bits of 1 bit are inserted right after the format identifier field 1101, and thus the decoder proceeds with decoding by considering only the fixed value padding bits which are pre-defined (1103). In addition, the decoder proceeds with decoding by considering paths regarding the next rest information bits of 3 bits (1104). As a result, in decoding the first, second bits in sequence in the SCL decoding considering the maximum number of paths L, the decoder calculates probabilities regarding three paths the bit values of which are 0-0, 0-1, 1-(padding fixed value), and leaves only L number of paths having the highest probability. When padding is considered according to a format as described above, the decoder proceeds with decoding while adaptively correcting the decoding paths of SCL decoding according to a value of the format identifier field decoded first during the decoding.

Figure 12:
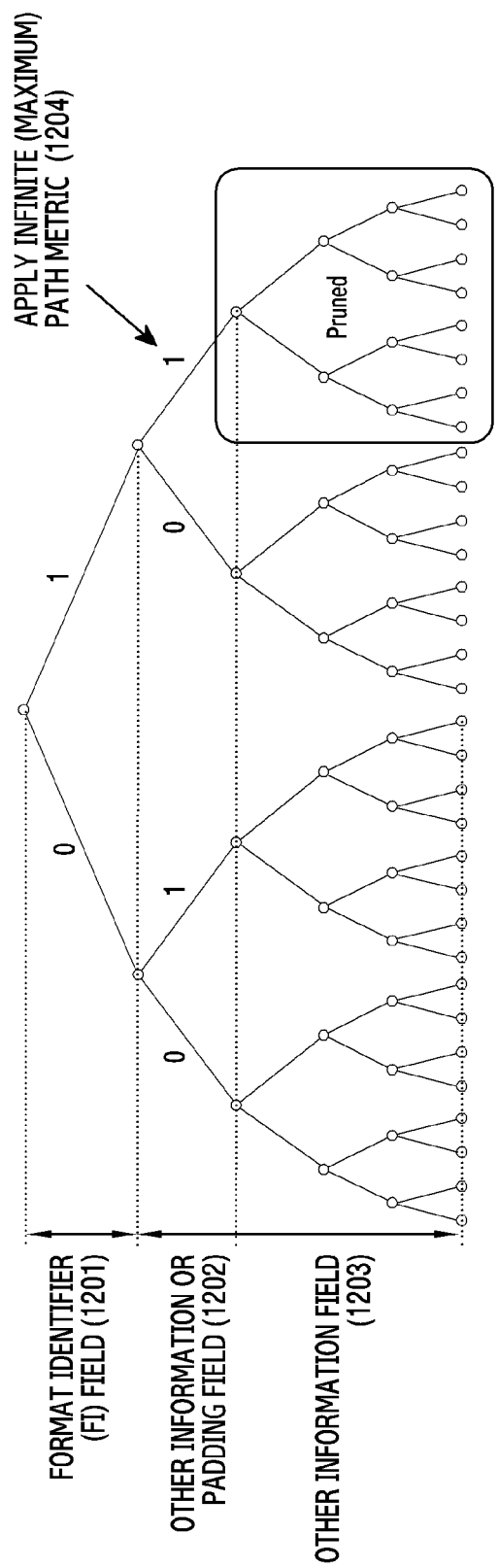
FIG. 12 is a view illustrating a process of decoding a signal generated by encoding an information bit sequence through generation of a fixed value padding bit in a wireless communication system according to various embodiments of the disclosure.

FIG. 12 illustrates a process of decoding a signal generated by encoding an information bit sequence through generation of fixed value padding bits in a wireless communication system according to various embodiments of the disclosure.

FIG. 12 illustrates a process of decoding in a method different from that of the embodiment of FIG. 11. It may be generally difficult for a decoder of a polar code to correct decoding paths adaptively according to a value of a format identifier field. Accordingly, to achieve the same effect as in the embodiment of FIG. 11, the decoder may intentionally fix a path metric value of a path, other than a pre-determined bit value, to a maximum value with respect to padding bits as shown in FIG. 12 (1204). In the SCL decoding, reliability is higher as the path metric of a path is smaller, and reliability is lower as the path metric is larger. Therefore, as decoding proceeds, a path of a larger path metric is naturally removed. Accordingly, if a path metric value of a path that does not have to be considered is fixed to a maximum value as shown in FIG. 12, the path that does not have to be considered in the SCL decoding process may be naturally removed.

The configuration of the information bit sequence based on fixed value padding in FIG. 10 enables the receiving node to deal with the padding bits as frozen bits, thereby making it possible to enhance performance. However, the disclosure suggests an information bit sequence configuration that helps the receiving node decode other information bits, by generating padding bits through linear combination or repetition of some of the other information bits.

Figure 13:
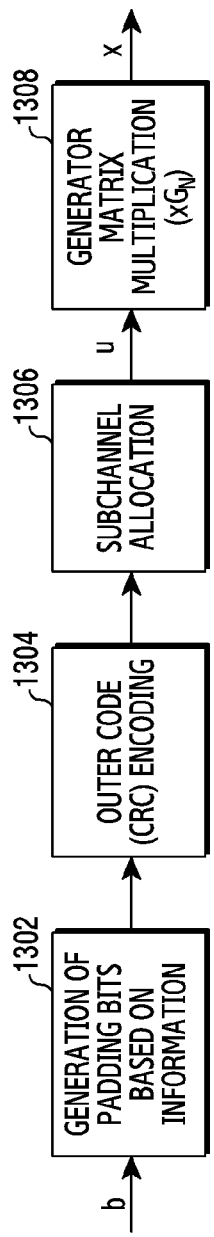
FIG. 13 is a view illustrating an encoding process of a polar code through generation of padding bits based on information bits in a wireless communication system according to various embodiments of the disclosure.

FIG. 13 illustrates an encoding process of a polar code through generation of padding bits based on information bits in a wireless communication system according various embodiments of the disclosure.

Referring to FIG. 13, a transmitting node generates padding bits through linear combination or repetition of some information bits by using an information-based padding bit generation block 1302, and configures an information bit sequence, prior to performing polar encoding using an outer encoding block 1304 of a CRC code, etc., a subchannel allocation block 1306, a generator matrix multiplication block 1308. The transmitting node determines the number of padding bits $K_p$ according to a format of a message. In addition, the transmitting node generates $K_p$ number of padding bits according to a defined method, such as linear combination, repetition, etc., with respect to some of the information bits (1302). After that, the transmitting node arranges the information bits and the padding bits according to a defined order, and then, may perform outer encoding of a CRC code, etc., encoding of a polar code as described above.

Figure 14:
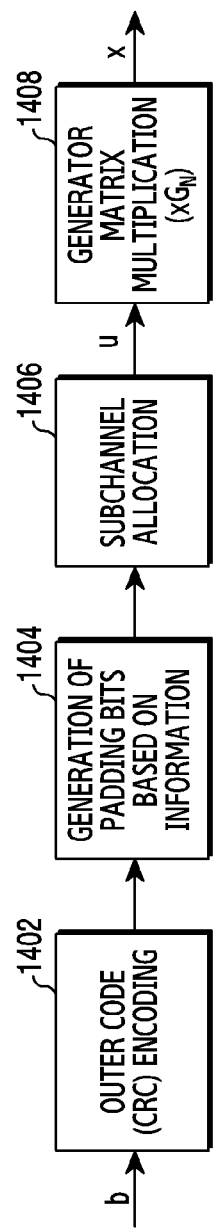
FIG. 14 is a view illustrating an encoding process of a polar code through generation of padding bits based on information bits in a wireless communication system according to various embodiments of the disclosure.

FIG. 14 illustrates an encoding process of a polar code through generation of padding bits based on information bits in a wireless communication system according to various embodiments of the disclosure.

Compared to the embodiment of FIG. 13, in the embodiment of FIG. 14, a positions of a padding bit generation block 1404 and a position of an outer code encoding block 1402 of a CRC code, etc. may be changed with each other. The transmitting node determines the number of padding bits $K_p$ according to a format of a message. In addition, the transmitting node performs outer code encoding of a CRC code, etc. by using the outer code encoding block 1402, and then, may generate $K_p$ number of padding bits according to a defined method, such as linear combination, repetition, etc., with respect to some of the outer encoding bits, by using the information-based padding bit generation block 1404. After that, the transmitting node arranges the information bits and the padding bits in a defined order, and then, performs encoding of the polar code by using a subchannel allocation block 1406, a generator matrix multiplication block 1408 as described above.

Figure 15:
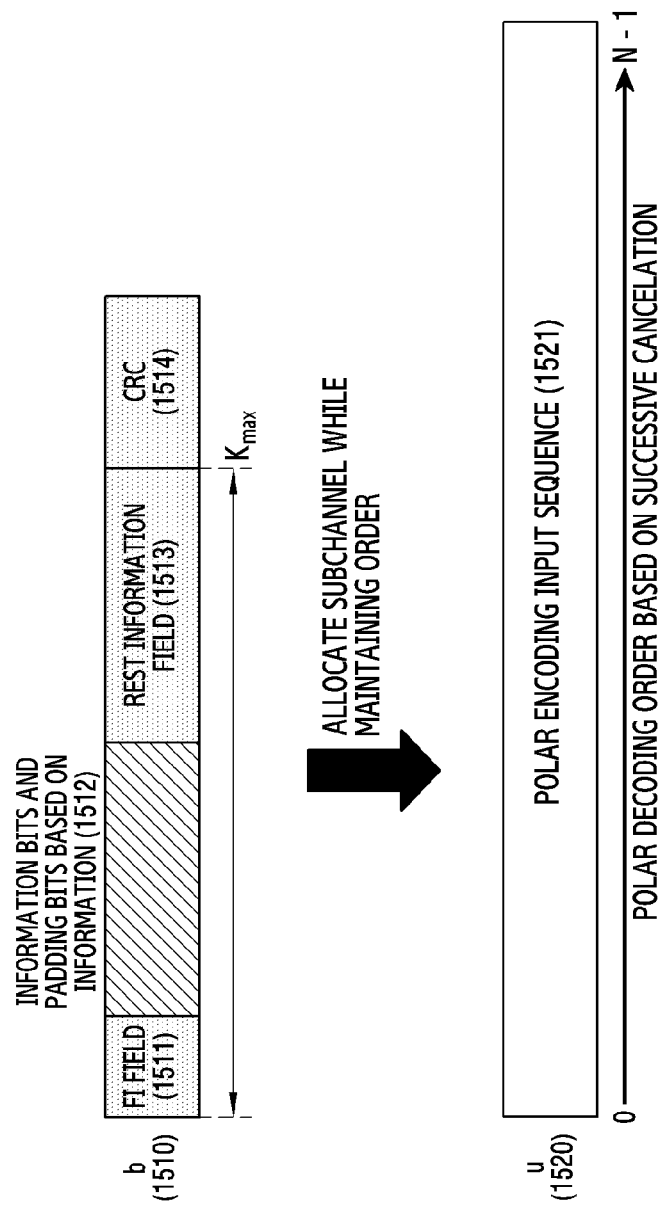
FIG. 15 is a view illustrating a configuration of an information bit sequence through generation of padding bits based on information bits, and a process of mapping the same onto a polar code input bit sequence in a wireless communication system according to various embodiments of the disclosure.

FIG. 15 illustrates a configuration of an information bit sequence through generation of padding bits based on information bits, and a process of mapping the same onto a polar code input bit sequence in a wireless communication system according to various embodiments of the disclosure.

FIG. 15 illustrates the result of padding bit generation of FIGS. 13, 14. An information bit sequence b 1510 is configured in order of a format identifier field 1511, a mixture field 1512 of some information bits and padding bits generated based on information, a rest information bit field 1513, an outer encoding parity bit field 1513. Herein, in the mixture field 1512 of some information bits and the padding bits generated based on information, some of the information bits and the padding bit may coexist. The padding bits generated based on the information does not have a fixed value that has nothing to do with the information bits, and are generated by linear combination or repetition of some information bits. Specifically, the information-based padding bits may be arranged to be generated by linear combination or repetition of information bits which are positioned at lower bit indexes than those of padding bits. Herein, the linear combination refers to calculating the modulo 2 sum (exclusive OR) of one or more information bits, and the repetition refers to copying one information bit as it is. In a broad sense, the linear combination includes the repetition. An information bit positioned at a low bit index that is involved in generation of the padding bit includes the format identifier field 1511 positioned at the lowest bit index. The information bit sequence b 1510 configured as described above is mapped onto the polar code input bit sequence u 920 while maintaining the order. Through the above-described configuration, an SC-based encoder of a receiving node decodes the padding bits generated based on each information after the information bits involved in generation of the corresponding padding bits.

Figure 16:
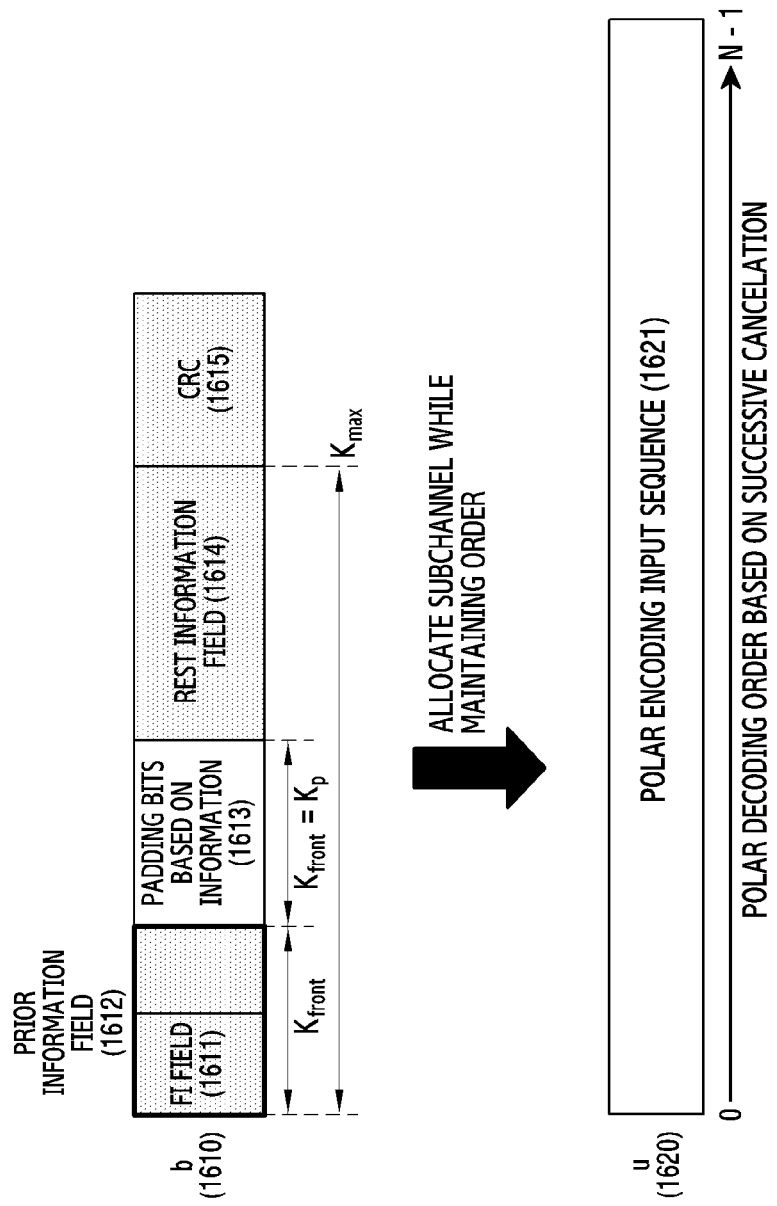
FIG. 16 is a view illustrating a configuration of an information bit sequence through generation of padding bits based on information bits, and a process of mapping the same onto a polar code input bit sequence in a wireless communication system according to various embodiments of the disclosure.

FIG. 16 illustrates a configuration of an information bit sequence through generation of padding bits based on information bits, and a process of mapping the same onto a polar code input bit sequence in a wireless communication system according to various embodiments.

FIG. 16 illustrates a specific embodiment of the result of generating padding bits in FIG. 15. According to the embodiment of FIG. 16, an information bit sequence b 1610 is configured in order of a prior information field 1612, a padding bit field 1613 generated based on information bits, a rest information bit field 1614, and an outer encoding parity bit field 1615. Herein, the prior information field 1612 is formed of information bits which are arranged ahead of the padding bit field, and includes a format identifier field 1611 for indicating or inferring the number of information bits K or the number of padding bits $K_p$. If the number of bits of the prior information field 1612 is $K_{front}$, and the number of bits of the format identifier field 1611 is $K_{F1}$, $K_{front} \geq K_{F1}$. The information bit sequence b 1610 is mapped onto a polar code input bit sequence u 1620 while maintaining the order. Through the above-described configuration, an SC-based decoder of a receiving node may decode the prior information field 1611 before the padding bit field 1013 generated based on information bits.

Figure 17:
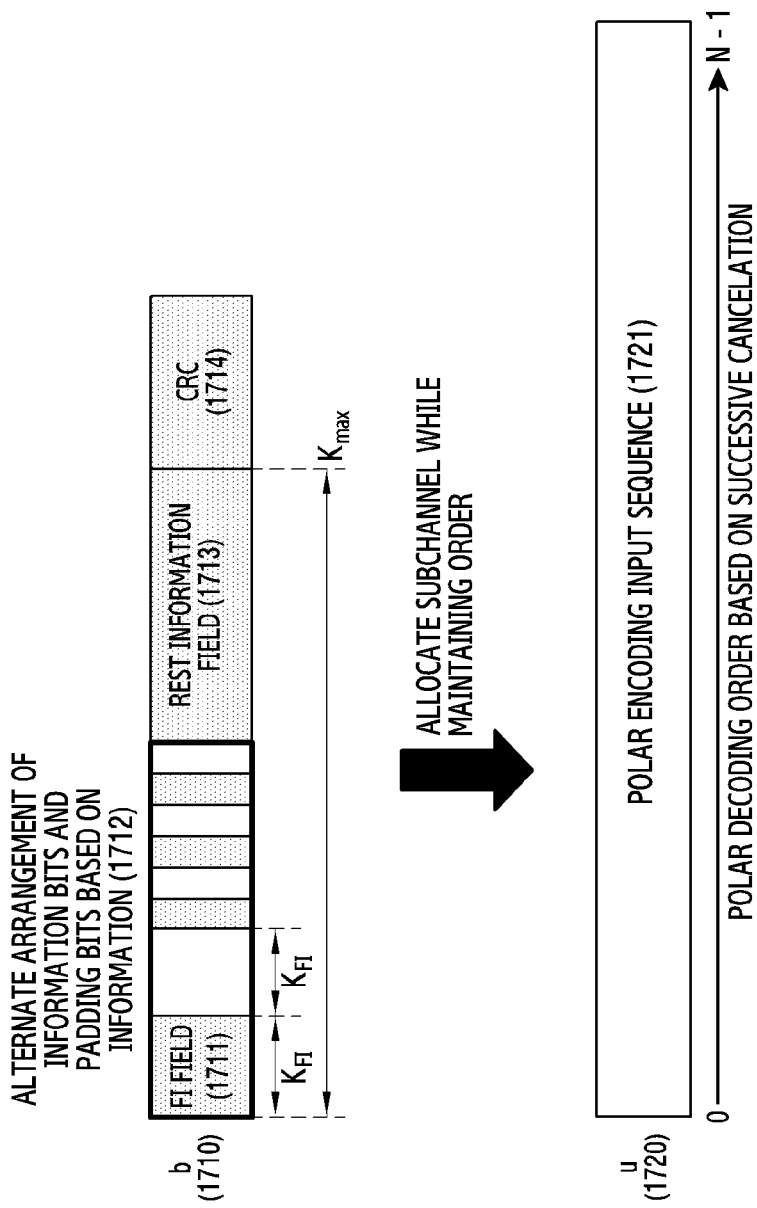
FIG. 17 is a view illustrating a configuration of an information bit sequence through generation of padding bits based on information bits, and a process of mapping the same onto a polar code input bit sequence in a wireless communication system according to various embodiments of the disclosure.

FIG. 17 illustrates a configuration of an information bit sequence through generation of padding bits based on information bits, and a process of mapping the same onto a polar code input bit sequence in a wireless communication system according to various embodiments of the disclosure.

FIG. 17 illustrates another embodiment of the result of generating padding bits in of FIG. 15. According to the embodiment of FIG. 17, an information bit sequence b 1710 is configured in order of a field 1712 in which a format identifier field 1711 is included, and some information bits and padding bits generated based on information bits are alternately arranged, a rest information bit field 1713, and an outer encoding parity bit field 1714. Herein, the field 1712 in which some information bits and padding bits generated based on information bits are alternately arranged is configured with $K_p$ number of some information bits and $K_p$ number of padding bits, and the format identifier field 1711 is arranged at the head of the field 1712 in which some information bits and the padding bits are alternately arranged. In the field 1712 in which some information bits and the padding bits are alternately arranged, some information bits and padding bits bit indexes of which are generated based on previous bits are alternately arranged. According to an embodiment, the field 1712 in which some information bits and the padding bits are alternately arranged is configured in order of the format identifier field of $K_{F1}$ number of pieces of information, $K_{F1}$ number of padding bits, $a_1$ number of information bits, $a_1$ number of padding bits, $a_2$ number of information bits, $a_2$ number of padding bits, . . . , $a_1$ number of information bit, and $a_1$ number of padding bits. Herein, $a_1$ may be set to have a natural number value satisfying $K_{F1}+a_1+a_2+ \ldots a_1=K_p$. As in the above-mentioned embodiment, the padding bits are generated based on the information bits, and are generated by linear combination or repetition of information bits the bit indexes of which precede the padding bits. The information bit sequence b 1710 is mapped onto a polar code input bit sequence u 1720 while maintaining the order. Through the above-described configuration, an SC-based decoder of a receiving node may decode the prior information field 1711 before the padding bit field 1113 generated based on the information bits.

There are various methods for generating and arranging padding bits based on information bits as described in FIGS. 15 to 17, and there may be various embodiments in addition to the embodiments of the disclosure. The following embodiments of tables 1 to 4 presented below are specific examples of generation of padding bits based on information bits. However, the embodiments of tables 1 to 4 do not limit various padding bit generation methods of the present disclosure.

TABLE 1

Embodiment 1-1) b' =
$\{b_0, b_1, \ldots, b_{K_p-1}, b_0, b_1, \ldots, b_{K_p-1}, b_{K_p}, b_{K_p+1}, \ldots, b_{K-1}\}$
Embodiment 1-2) b' =
$\{b_0, b_0, b_1, b_1, \ldots, b_{K_p-1}, b_{K_p-1}, b_{K_p}, b_{K_p+1}, \ldots, b_{K-1}\}$
Embodiment 1-3) b' =
$\{b_0, b_1, b_0, b_1, b_2, b_3, b_2, b_3, \ldots, b_{K_p-2}, b_{K_p-1}, b_{K_p-2}, b_{K_p-1}, b_{K_p}, b_{K_p+1}, \ldots, b_{K-1}\}$
Embodiment 1-4) b' =
$\{b_0, b_1, b_2, b_0, b_1, b_2, \ldots, b_{K_p-3}, b_{K_p-2}, b_{K_p-1}, b_{K_p-3}, b_{K_p-2}, b_{K_p-1}, b_{K_p}, \ldots, b_{K-1}\}$ Table 1 shows embodiments of an information bit sequence b' which is configured when padding bits are generated by repetition, considering that $K_{F1}=1$. The embodiments of table 1 do not limit the padding bit generation methods of the present disclosure. Herein, $b_0$, $b_1$, ... $b_{K-1}$, which is a set of bits before padding is performed, may be a bit sequence as a result of outer code encoding of CRC, etc., or may be a bit sequence to be inputted to outer code encoding of CRC, etc. In the information bit sequence b' of embodiment 1-1 of table 1, $K_p$ number of bits including a format identifier field are set as prior information bits, and, right after, $K_p$ number of padding bits are generated by repeating the prior information bits as they are. In the information bit sequence b' of embodiment 1-2 of table 1, $K_p$ number of information bits including a format identifier field, and the same number of padding bits are arranged alternately in the unit of 1 bit, and the padding bit is generated by repeating the information bit arranged right before. In the information bit sequence b' of embodiment 1-3 of table 1, $K_p$ number of information bits including a format identifier field, and the same number of padding bits are arranged alternately in the unit of 2 bits, and two respective padding bits are generated by repeating two information bits arranged right before. In the information bit sequence b' of embodiment 1-4 of table 1, $K_p$ number of information bits including a format identifier field, and the same number of padding bits are arranged alternately in the unit of 3 bits, and 3 respective padding bits are generated by repeating 3 information bits arranged right before.

TABLE 2

Embodiment 2-1) b' =
$\{b_0, b_1, \ldots, b_{K_p-1}, b_0, b_0 \oplus b_1, b_2 \oplus b_3, \ldots, b_{K_p-2} \oplus b_{K_p-1}, b_{K_p}, b_{K_p+1}, \ldots, b_{K-1}\}$
Embodiment 2-2) b' =
$\{b_0, b_0, b_1, b_0 \oplus b_1, b_2, b_1 \oplus b_2 \ldots, b_{K_p-1}, b_{K_p-2} \oplus b_{K_p-1}, b_{K_p}, b_{K_p+1}, \ldots, b_{K-1}\}$ Table 2 shows embodiments of an information bit sequence b' which is configured when padding bits are generated by linear combination, considering that $K_{F1=1}$. The embodiments of table 2 do not limit the padding bit generation methods of the disclosure. Herein, $b_0, b_1, \ldots b_{K-1}$ which is a set of bits before padding is performed may be a bit sequence as a result of outer code encoding of CRC, etc., or may be a bit sequence to be inputted to outer code encoding of CRC, etc. In the information bit sequence b' of embodiment 2-1 of table 2, $K_p$ number of bits including a format identifier field are set as prior information bits, and $K_p$ number of padding bits are generated by linear combination of the prior information bits. The sign $\otimes$ indicates the modulo 2 sum or XOR operation, and the linear combination equation for padding bit generation of embodiment 2-1 is merely an example, and may be designed in various forms.

In the information bit sequence b' of embodiment 2-2 of table 2, $K_p$ number of information bits including a format identifier field, and padding bits are arranged alternately in the unit of 1 bit, and the padding bits are generated by linear combination of the information bits arranged before. The linear combination equation for padding bit generation of embodiment 2-2 is merely an example, and the information bit sequence b' may be designed in various forms.

TABLE 3

Embodiment 3-1) b' =
$\{b_0, b_1, \ldots, b_{K_p-1}, b_0, b_1, \ldots, b_{K_p-1}, b_{K_p}, b_{K_p+1}, \ldots, b_{K-1}\}$
Embodiment 3-2) b' =
$\{b_0, b_1, b_0, b_1, b_2, b_2, b_3, b_3, \ldots, b_{K_p-1}, b_{K_p-1}, b_{K_p}, b_{K_p+1}, \ldots, b_{K-1}\}$ Table 3 shows embodiments of an information bit sequence b' which is configured when padding bits are generated by repetition, considering that $K_{F1}=2$. The embodiments of table 3 do not limit the padding bit generation methods of the disclosure. Herein, $b_0, b_1, \ldots b_{K-1}$ which is a set of bits before padding is performed may be a bit sequence as a result of outer encoding of CRC, etc., or may be a bit sequence to be inputted to outer code encoding of CRC, etc. In the information bit sequence b' of embodiment 3-1 of table 3, $K_p$ number of bits including a format identifier field are set as prior information bits, and right after, $K_p$ number of padding bits are generated by repetition of the prior information bits. In the information bit sequence b' of embodiment 3-2 of table 3, 2 bits of a format identifier field are arranged at the head, first, and next, padding bits are generated by repetition of 2 bits of the format identifier field. In addition, $K_p$-2 number of information bits and the same number of padding bits are arranged alternately in the unit of 1 bit, and the padding bit is generated by repetition of the previous information bit.

TABLE 4

Embodiment 4-1) b' = $\{b_0, b_1, b_2, b_0, b_1, b_2, b_0, b_1, b_3, b_4, \ldots, b_{K-1}\}$
Embodiment 4-2) b' = $\{b_0, b_1, b_2, b_0, b_1, b_3, b_4, \ldots, b_{K-1}\}$ Table 4 shows embodiments of an information bit sequence b' which is configured when padding bits are generated by repetition, considering that $K_{F1}=3$. The embodiments of table 4 do not limit the padding bit generation methods of the disclosure. Herein, $b_0, b_1, \ldots b_{K-1}$ which is a set of bits before padding is performed may be a bit sequence as a result of outer code encoding of CRC, etc., or may be a bit sequence to be inputted to outer code encoding of CRC, etc. Herein, a format identifier field is $b_0$, $b_1$, $b_2$. In the information bit sequence b' of embodiment 4-1 of table 4, it is assumed that $K_p=5$. First, 3 bits of the format identifier field are arranged at the head, and right after, $K_p=5$ number of padding bits are arranged. The padding bits may be generated in the form of continuous repetition of the previous format identifier field. For example, 5 padding bits may be determined to have a value of $b_0$, $b_1$, $b_2$, $b_0$, $b_1$. The padding bits may be generated by linear combination of 3 bits of the format identifier field. In the information bit sequence b' of embodiment 4-2 of table 4, it is assumed that $K_p=2$. First, 3 bits of the format identifier field are arranged at the head, and right after, $K_p=2$ number of padding bits are arranged. The padding bits are generated by repetition of the previous format identifier field, and since the number of padding bits $K_p$ is smaller than the size of the format identifier field, only some format identifier fields are repeated. For example, two padding bits are determined to have values of $b_0$, $b_1$ out of 3 bits of the format identifier field. The padding bits may be generated by linear combination of 3 bits of the format identifier field.

Figure 18:
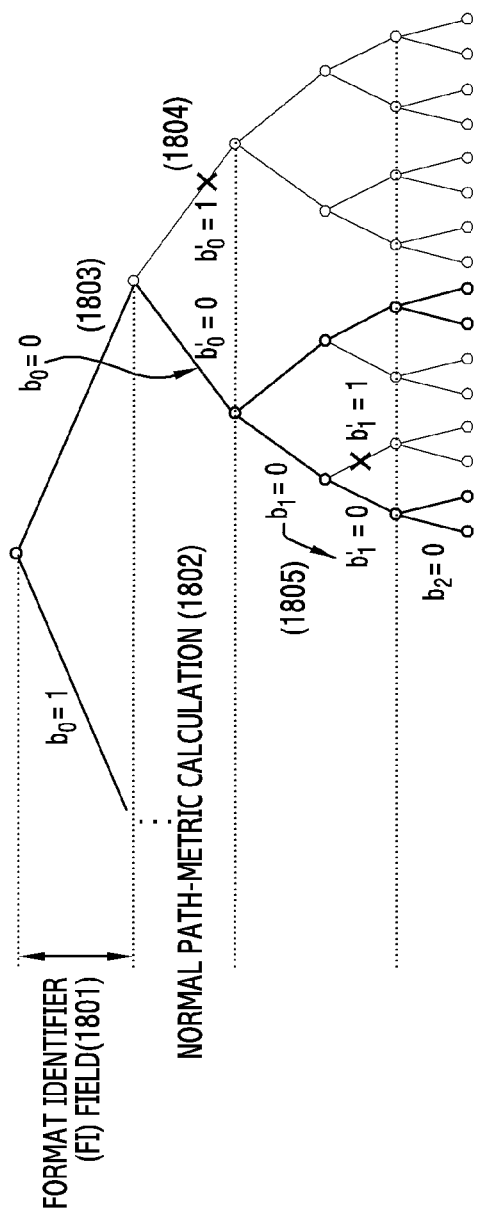
FIG. 18 is a view illustrating a process of decoding a signal generated by encoding an information bit sequence through generation of padding bits based on information bits in a wireless communication system according to various embodiments of the disclosure.

FIG. 18 illustrates a process of decoding a signal generated by encoding an information bit sequence through generation of padding bits based on information bits in a wireless communication system according to various embodiments of the disclosure.

FIG. 18 illustrates operations performed by an SCL decoder of a receiving node when padding bits are generated based on information bits. In the embodiment of FIG. 18, $K_{F1}=1$, and $K_p=0$ if the format identifier field is 1 and $K_p=2$ if the format identifier field is 0. In the present embodiment, if the format identifier field is 0, a head portion of the information bit sequence is configured like $b_0$, $b_0$, $b_1$, $b_1$, $b_2$, $b_2$, . . . . To distinguish information bits and padding bits generated by repetition of the information bits, the padding bit in FIG. 18 is expressed as $b'_0$. Since the padding bits do not need to be considered regarding paths if the format identifier field 1801 is 1 during SCL decoding, the decoder performs normal path expansion (1802). With respect to paths if the format identifier field 1801 is 0, pruning is performed for the paths according to previous information bit values involved in generation of the padding bits. In the present embodiment, $b'_0$ should have the same value as the already decoded $b_0$. In the present embodiment, since $b_0$ has a value of 0 as the format identifier field bit, the decoder considers only the path in which $b'_0=0$ (1803). Accordingly, since the case where $b'_0=1$ does not need to be considered, the decoder should perform pruning regarding the path of the case where $b'_0=1$ (1804). Various methods for pruning the path, such as forcedly fixing a path metric of the path to a specific value and then making the path naturally pruned, or forcedly excluding the path in decoding, may be used. Thereafter, the decoder performs decoding with respect to $b_1$, and, when performing padding bit performs appropriate pruning by considering $b_1$ which is considered in the corresponding path (1805).

Figure 19:
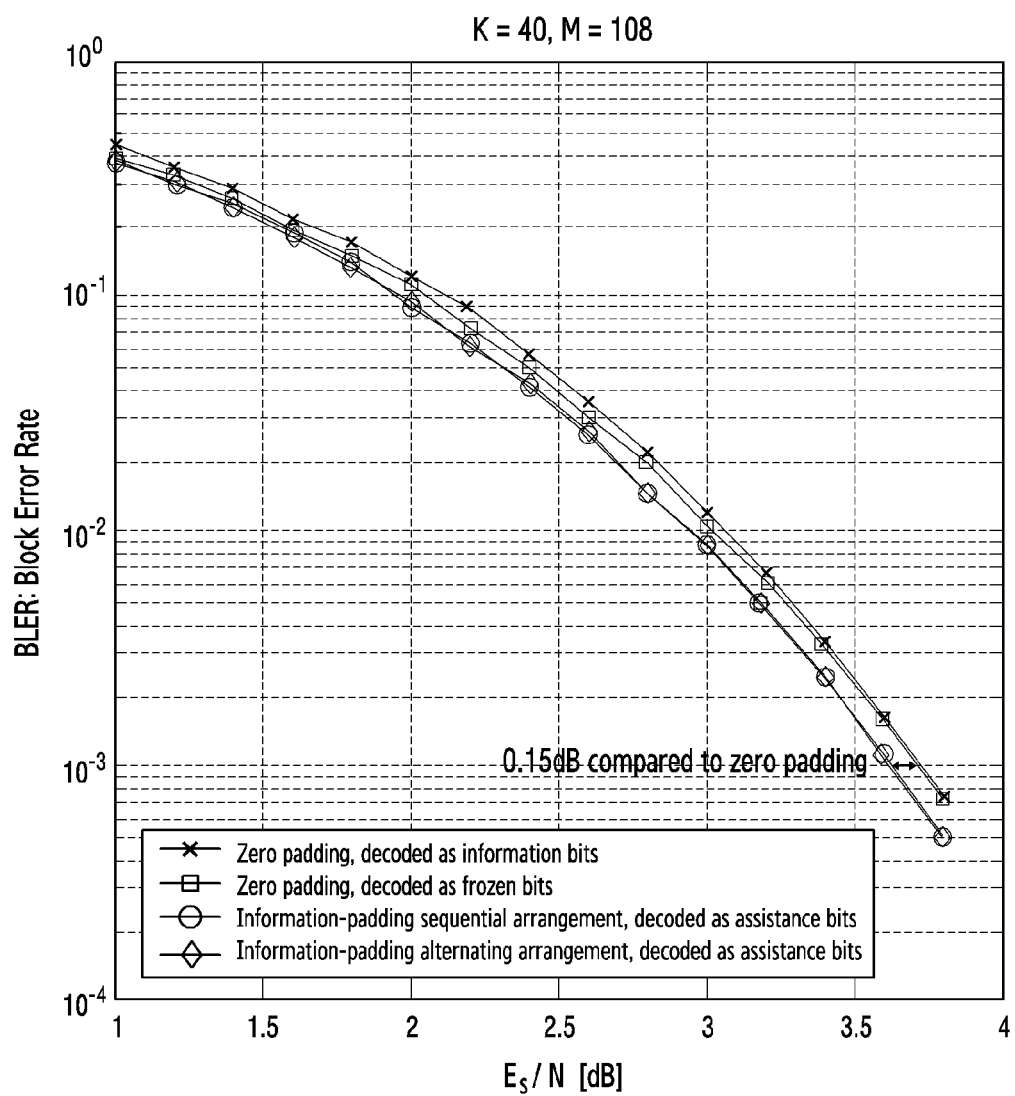
FIG. 19 is a view illustrating error correction performance of generation of padding bits based on information bits in a wireless communication system according to various embodiments of the disclosure.

FIG. 19 illustrates error correction performance of generation of padding bits based on information bits in a wireless communication system according to various embodiments of the disclosure.

An exemplary condition of the embodiment of FIG. 19 is that length of information bits is variable from 36 bits or 40 bits, and length of bits transmitted as a result of encoding is 108 bits. In the information bits, a format identifier field of 1 bit is included, and, the length of the information bits is 36 bits if the value of the format identifier field is 0, and the length of the information bit is 40 bits if the value of the format identifier field is 1. Through the embodiment of FIG. 19, performances of combinations of four different padding methods and decoding methods if the format identifier field is 0 are compared and evaluated. In the first configuration, the information bit sequence is configured like $b'=\{b_0, 0, 0, 0, 0, b_1, b_2, \ldots b_{35}\}$ by considering fixed value padding, and the receiving node decodes by dealing with the padding bits as information bits. In this case, positions of the padding bits formed of fixed values may be determined without limitation, but are arbitrarily configured as in the above-described example. In the second configuration, the information bit sequence is configured like $b'=\{b_0, 0, 0, 0, 0, b_1, b_2, \ldots b_{35}\}$ considering fixed value padding, but the receiving node decodes by dealing with the padding bits as frozen bits. Since the padding bits are dealt with as the frozen bits, the padding bits are configured as described above to enhance performance. In the third configuration, the information bit sequence is configured like $b'=\{b_0, b_1, b_2, b_3, b_0, b_1, b_2, b_3, b_4, b_5 \ldots b_{35}\}$ by considering generation of the padding bits based on the information bits, and the receiving node uses the padding bits to help in identifying information bit values decoded at the front. In the fourth configuration, the information bit sequence is configured like $b'=\{b_0, b_0, b_1, b_1, b_2, b_2, b_3, b_3, b_4, b_5 \ldots b_{35}\}$ by considering generation of the padding bits based on the information bits, and likewise, the receiving node uses the padding bits to help in identifying information bit values decoded at the front. Referring to FIG. 9 showing error correction performances of the configurations as described above, when padding bits are generated based on information bits, that is, in the case of the third and fourth configurations, a performance gain of about 0.15 dB can be achieved in an AWGN channel only with a configuration of a message, compared to the case where padding bits are generated as zero which is a fixed value, that is, the case of the first and second configurations. Accordingly, the polar code configuration applying the padding bits based on the information bits according to the embodiments of the disclosure can achieve better error correction performance simply by changing to a configuration with low complexity, compared to a polar code configuration applying padding bits of a fixed value.

Methods based on the claims or the embodiments disclosed in specification of the disclosure may be implemented in hardware, software, or a combination of both.

When implemented in software, a computer readable storage medium for storing one or more programs (software modules) may be provided. The one or more programs stored in the computer readable storage medium are configured for execution performed by one or more processors in an electronic device. The one or more programs include instructions for allowing the electronic device to execute the methods based on the claims or the embodiments disclosed in specification of the disclosure.

The program (the software module or software) may be stored in a random access memory, a non-volatile memory including a flash memory, a read only memory (ROM), an electrically erasable programmable read only memory (EEPROM), a magnetic disc storage device, a compact disc-ROM (CD-ROM), digital versatile discs (DVDs) or other forms of optical storage devices, and a magnetic cassette. Alternatively, the program may be stored in a memory configured in combination of all or some of these storage media. In addition, the configured memory may be plural in number.

Further, the program may be stored in an attachable storage device capable of accessing the electronic device through a communication network such as the Internet, an Intranet, a local area network (LAN), a wide area network (WAN), or a storage area network (SAN) or a communication network configured by combining the networks. The storage device may access via an external port a device which performs the embodiments of the disclosure. In addition, an additional storage device on a communication network may access a device which performs the embodiments of the disclosure.

In the above-described specific embodiments of the disclosure, elements included in the present disclosure are expressed in singular or plural forms according to specific embodiments. However, singular or plural forms are appropriately selected according to suggested situations for convenience of explanation, and the disclosure is not limited to a single element or plural elements. An element which is expressed in a plural form may be configured in a singular form or an element which is expressed in a singular form may be configured in plural number.

While specific embodiments have been described in the detailed descriptions of the disclosure, it will be understood by those skilled in the art that various changes in form and details may be made therein without departing from the spirit and scope of the disclosure as defined by the appended claims. Therefore, the scope of the disclosure is defined not by the described embodiments but by the appended claims, and all differences within the scope will be construed as being included in the disclosure.

The invention claimed is:

1. An operating method of a transmitting node in a wireless communication system, the method comprising:
   identifying a number of padding bits based on a maximum length of an information bit sequence and a number of information bits to be transmitted;
   generating the padding bits based on the information bits and the number of the padding bits;
   generating an input bit sequence comprising the padding bits and the information bits, wherein the input bit sequence includes in order of a format identifier field, a mixture field of a part of the information bits and the padding bits, and a rest information bit field, wherein the number of the information bits to be transmitted is identified based on a value of the format identifier field;
   generating a message by encoding the input bit sequence by using a polar code; and
   transmitting the message.

2. The method of claim 1, wherein generating the padding bits based on the information bits comprises generating the padding bits by repeating at least some of the information bits.

3. The method of claim 1, wherein generating the padding bits based on the information bits comprises generating the padding bits by linearly combining at least some of the information bits.

4. The method of claim 1, wherein generating the input bit sequence comprising the padding bits and the information bits comprises generating the input bit sequence by alternately arranging the padding bits and the information bits.

5. An operating method of a receiving node in a wireless communication system, the method comprising:
   receiving a message including an input bit sequence, wherein the input bit sequence includes in order of a format identifier field, a mixture field comprising information bits and padding bits, and a rest information bit field;
   decoding a first field comprising the format identifier field in the input bit sequence according to a polar code; and
   decoding a second field comprising information bits and padding bits, based on the format identifier field, wherein a number of the information bits is identified based on a value of the format identifier field,
   wherein a number of the padding bits is based on a maximum length of an information bit sequence and a number of the information bits, and
   wherein the padding bits are based on the information bits and the number of the padding bits.

6. The method of claim 5, further comprising identifying the number of the padding bits based on the format identifier field.

7. The method of claim 5, wherein decoding the second field comprises, when one of the padding bits is decoded, setting a probability of a path corresponding a value of the one of the padding bits to a pre-defined value.

8. The method of claim 5, wherein decoding the second field comprises, when one of the padding bits is decoded, pruning a path different from a path corresponding to a value of the one of the padding bits.

9. An apparatus of a transmitting node in a wireless communication system, the apparatus comprising:
   a transceiver configured to transmit and receive a signal; and
   at least one processor,
   wherein the at least one processor is configured to:
      identify a number of padding bits based on a maximum length of an information bit sequence and a number of information bits to be transmitted;
      generate the padding bits based on the information bits and the number of the padding bits;
      generate an input bit sequence comprising the padding bits and the information bits, wherein the input bit sequence includes in order of a format identifier field, a mixture field of a part of the information bits and the padding bits, and a rest information bit field, wherein the number of the information bits to be transmitted is identified based on a value of the format identifier field;
      generate a message by encoding the input bit sequence by using a polar code; and
      transmit the message.

10. The apparatus of claim 9, wherein the at least one processor is further configured to generate the padding bits by repeating at least some of the information bits.

11. The apparatus of claim 9, wherein the at least one processor is further configured to generate the padding bits by linearly combining at least some of the information bits.

12. The apparatus of claim 9, wherein the at least one processor is further configured to generate the input bit sequence by alternately arranging the padding bits and the information bits.

* * * * *